(12) United States Patent
Douskey et al.

(10) Patent No.: US 7,915,929 B2
(45) Date of Patent: Mar. 29, 2011

(54) HIGH-SPEED LEAF CLOCK FREQUENCY-DIVIDER/SPLITTER

(75) Inventors: Steven Michael Douskey, Rochester, MN (US); Matthew Roger Ellavsky, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 1107 days.

(21) Appl. No.: 11/623,893

(22) Filed: Jan. 17, 2007

(65) Prior Publication Data
US 2008/0169848 A1 Jul. 17, 2008

(51) Int. Cl.
*H03B 19/00* (2006.01)
(52) U.S. Cl. ......................................... 327/117; 327/113
(58) Field of Classification Search .......... 327/113–118, 327/122
See application file for complete search history.

(56) References Cited

U.S. PATENT DOCUMENTS

| | | | |
|---|---|---|---|
| 3,864,679 A | 2/1975 | Hannan et al. | |
| 6,184,736 B1 * | 2/2001 | Wissell et al. | 327/295 |
| 6,292,231 B1 | 9/2001 | Kawata et al. | |
| 6,448,835 B1 | 9/2002 | Douskey et al. | |
| 6,466,165 B2 | 10/2002 | Obayashi | |
| 2006/0091928 A1* | 5/2006 | Kapur | 327/298 |
| 2008/0169848 A1 | 7/2008 | Douskey et al. | |

OTHER PUBLICATIONS

Office Action dated Dec. 19, 2008, U.S. Appl. No. 11/859,175, USPTO.

* cited by examiner

*Primary Examiner* — Dinh T. Le
(74) *Attorney, Agent, or Firm* — Dillon & Yudell LLP

(57) ABSTRACT

A novel clock splitter that has a local internal clock frequency-divider is presented. The clock splitter comprises an oscillator clock splitter, wherein the oscillator clock splitter splits an oscillator clock signal into a B clock and a C clock; a clock frequency-divider, wherein the clock frequency-divider selectively suppresses clock pulses in the C clock to generate a slower C clock signal that is slower than the oscillator clock; and a B/C clock order logic, wherein the B/C clock order logic phase shifts the C clock relative to a B clock. The clock frequency-divider may selectively suppress pulses in the B clock to generate a slower B clock signal. The slower B and C clock signals may have a same or different frequency. In one embodiment, the clock splitter is located at a terminal leaf of a clock tree.

7 Claims, 12 Drawing Sheets

HIGH-SPEED LEAF CLOCK FREQUENCY-DIVIDER/SPLITTER

BACKGROUND OF THE INVENTION

1. Technical Field

The present disclosure relates in general to the field of electronics, and in particular to timing clocks in electronic circuits. Still more particularly, the present disclosure relates to a clock splitter having an integrated clock frequency-divider.

2. Description of the Related Art

Timing of clock signals in an electronic circuit, including an Integrated Circuit (IC), is essential to proper operations of the circuit. Timing problems arise, however, when components of the IC are physically spaced far apart. In such scenarios, a clock signal from one component will be time-delayed before it reaches another component. If the two components have a synchronous relationship, then problems will ensue.

For example, consider the circuit shown in FIG. 1. An oscillator 100 generates a 1.0 GHz clock signal. While this clock signal frequency is useful in many components of a circuit, other components may need a lower frequency clock signal. To obtain a lower frequency, a clock frequency-divider 102 is utilized. In the example shown, clock frequency-divider 102 suppresses every other clock waveform, thus created a clock signal that has a frequency of 0.5 GHz (500 MHz).

The two (different frequency) clock signals are then sent to clock splitters 104a-b, which output two clock signals (ZC and ZB), which have the same frequency as the respective input clock signal, but are time shifted. This allows the slave latch B and the master latch C in the Shift Register Latch (SRL) 106a-e to launch and capture data stored in these elements. For example, the clock signal ZB from clock splitter 104a causes data in latch B from SRL 106a to be launched to latch C in SRL 106b. Clock signal ZC from clock splitter 104a causes latch C in SRL 106b to capture the data that was just launched from latch B in SRL 106a. Similarly, clock signals ZC and ZB from clock splitter 104a cause data to be launched and captured from latch 106b to latch 106c.

Similarly, the clock signals ZC and ZB in clock splitter 104b cause data to be launched and captured from latch B in SRL 106d to latch C in SRL 106e. Assume that data captured in latches 106c and 106e are synchronously dependent. That is, assume that data must be captured (or launched) from these two latches at exactly the same time. Alternatively, latches 106c and 106e may be directly or indirectly coupled. If so, then the timing between these two latches must be perfectly synchronized. However, because of the distance (and distance differences) between oscillator 100 and latches 106c and 106e, such signal synchronization is difficult, if not impossible, to achieve.

SUMMARY OF THE INVENTION

To address the problem described above, presented herein is a novel clock splitter that has a local internal clock frequency-divider. The clock splitter comprises an oscillator clock splitter, wherein the oscillator clock splitter splits an oscillator clock signal into a B clock and a C clock; a clock frequency-divider, wherein the clock frequency-divider selectively suppresses clock pulses in the C clock to generate a slower C clock signal that has a lower frequency than the oscillator clock; and a B/C clock order logic, wherein the B/C clock order logic phase shifts the C clock relative to a B clock. The clock frequency-divider can also selectively suppress pulses in the B clock to generate a correspondingly slower B clock signal. The slower B and C clock signals may have a same or different frequency. In one embodiment, the clock splitter is located at a terminal leaf of a clock tree.

The above, as well as additional, purposes, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further purposes and advantages thereof, will best be understood by reference to the following detailed description of an illustrative embodiment when read in conjunction with the accompanying drawings, where:

DETAILED DESCRIPTION OF THE PREFERRED EMBODIMENT

Figure 1:
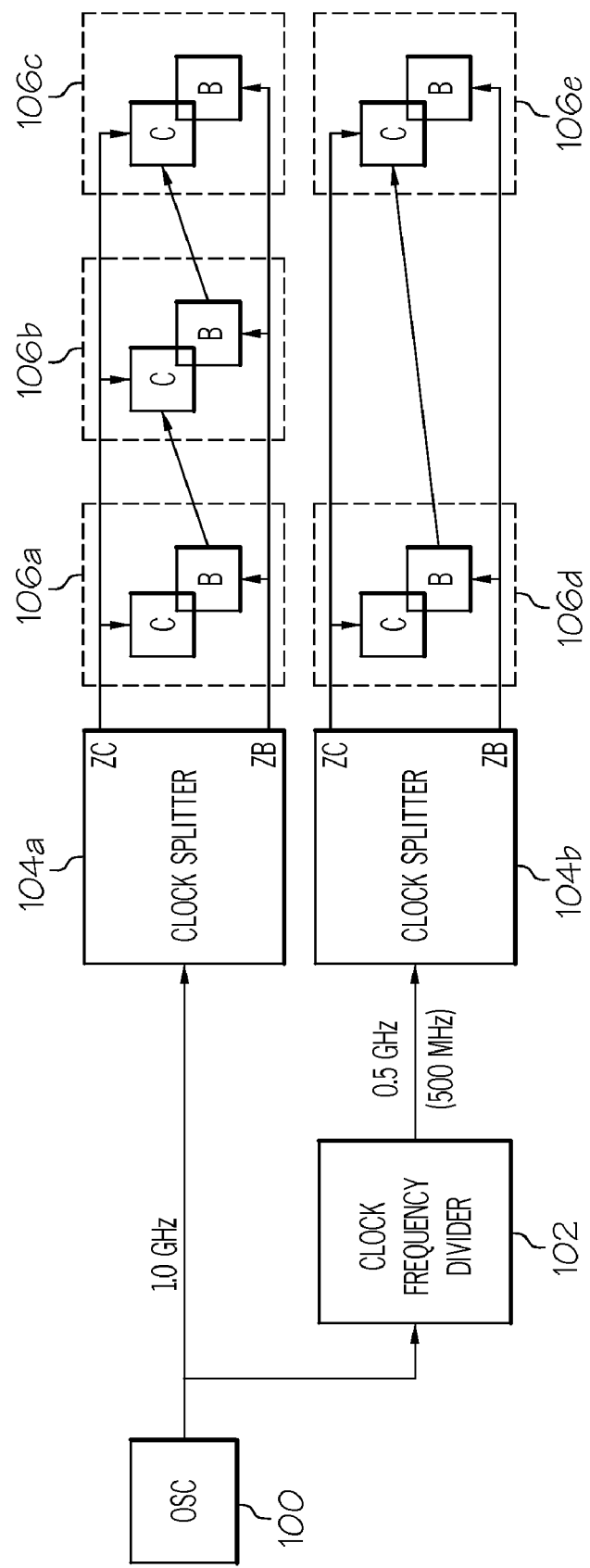
FIG. 1 depicts a prior art circuit having a clock frequency-divider that is distant from a clock splitter.
Figure 2:
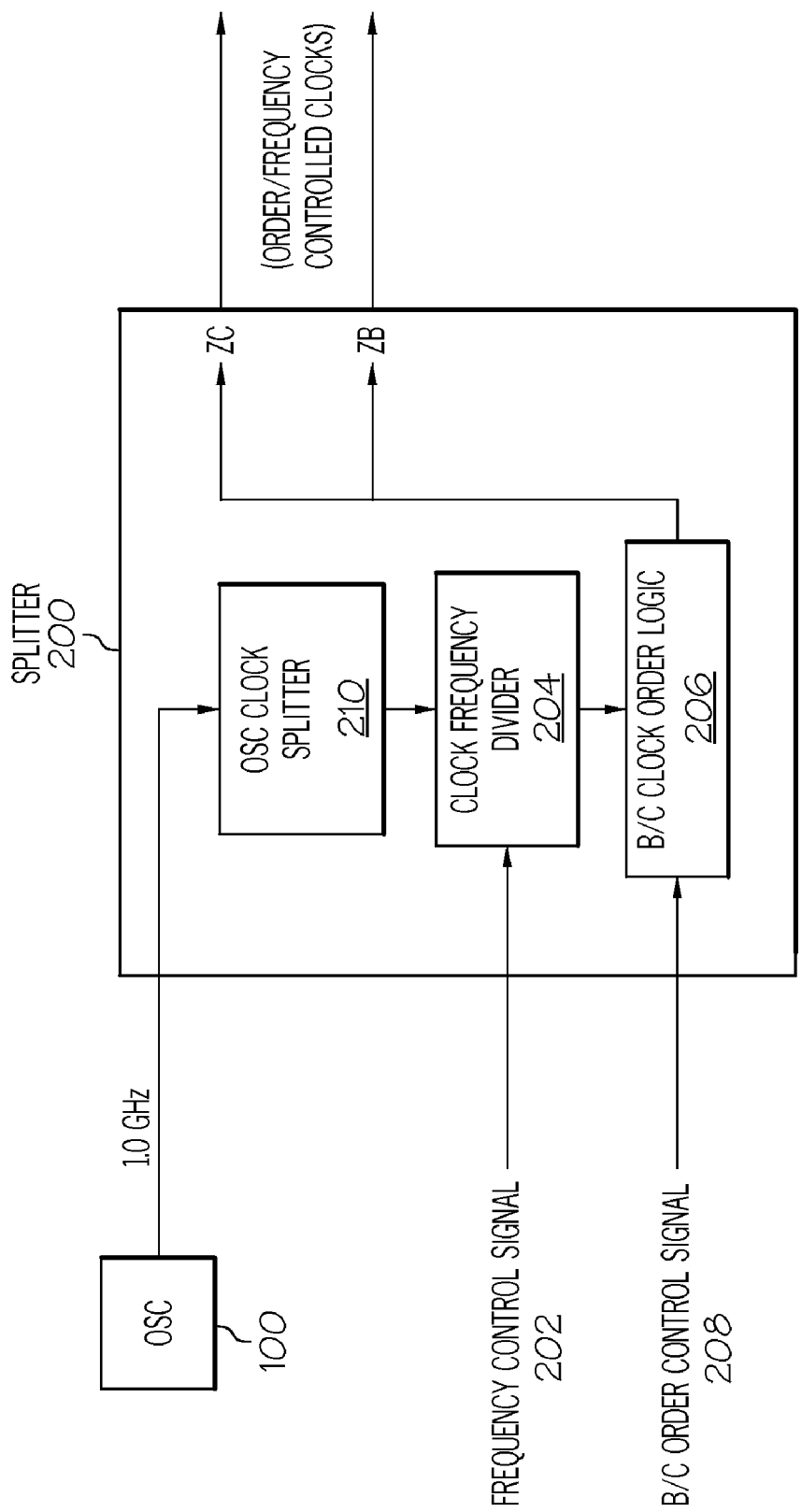
FIG. 2 illustrates a high level conceptual figure describing a novel clock splitter ("splitter") having an internal clock frequency-divider.

Referring now to FIG. 2, a high-level overview of an inventive splitter 200 is presented. In a preferred embodiment, splitter 200 is at a leaf (termination point) of a clock tree. That is, in a preferred embodiment, splitter 200 provides clocking signals that are only used locally, and are not promulgated to other branches in a clock tree.

A clock signal is generated by an oscillator 100. For exemplary purposes, the frequency of the clock signal is shown as 1.0 GHz, but oscillator (OSC) 100 is understood as being capable of generating any fixed frequency clock signal. The oscillator clock signal is split into a B clock signal and a C clock signal by an OSC clock splitter 210. From the OSC clock splitter 210, the B and C clock signals are sent to a clock frequency-divider 204, which is under the control of a frequency control signal 202. The B and C clock signals are preferably chopped such that they have a same frequency, although, alternatively, the B and C clock signals can be chopped independently such that the B and C clock signals have different frequencies. Clock frequency-divider 204 preferably "chops" (removes/suppresses) intermediary clock waveforms to reduce (divide) the frequency of the 1.0 GHz clock signal (e.g., down to 0.5 GHz or 0.33 GHz). Note, however, that the frequency control signal 202 may simply tell clock frequency-divider 204 to allow the 1.0 GHz clock signal to pass through clock frequency-divider 204 unaltered (still at 1.0 GHz). In either case, the B and C clock signals (altered or unaltered) are then sent to a B/C clock order logic 206, which is under the control of a B/C order control signal 208. B/C order control signal 208 directs B/C clock order logic 206 to time-shift the B and C clock signals such that the B clock signal is time/phase shifted before or after the C clock signal.

The scenario shown in FIG. 2 permits the B and C clock signals to have the same or different frequencies. Alternatively, the clock frequency-divider 204 can be placed before the OSC clock splitter 210, such that the B and C clock signals are always at the same frequencies.

Figure 3:
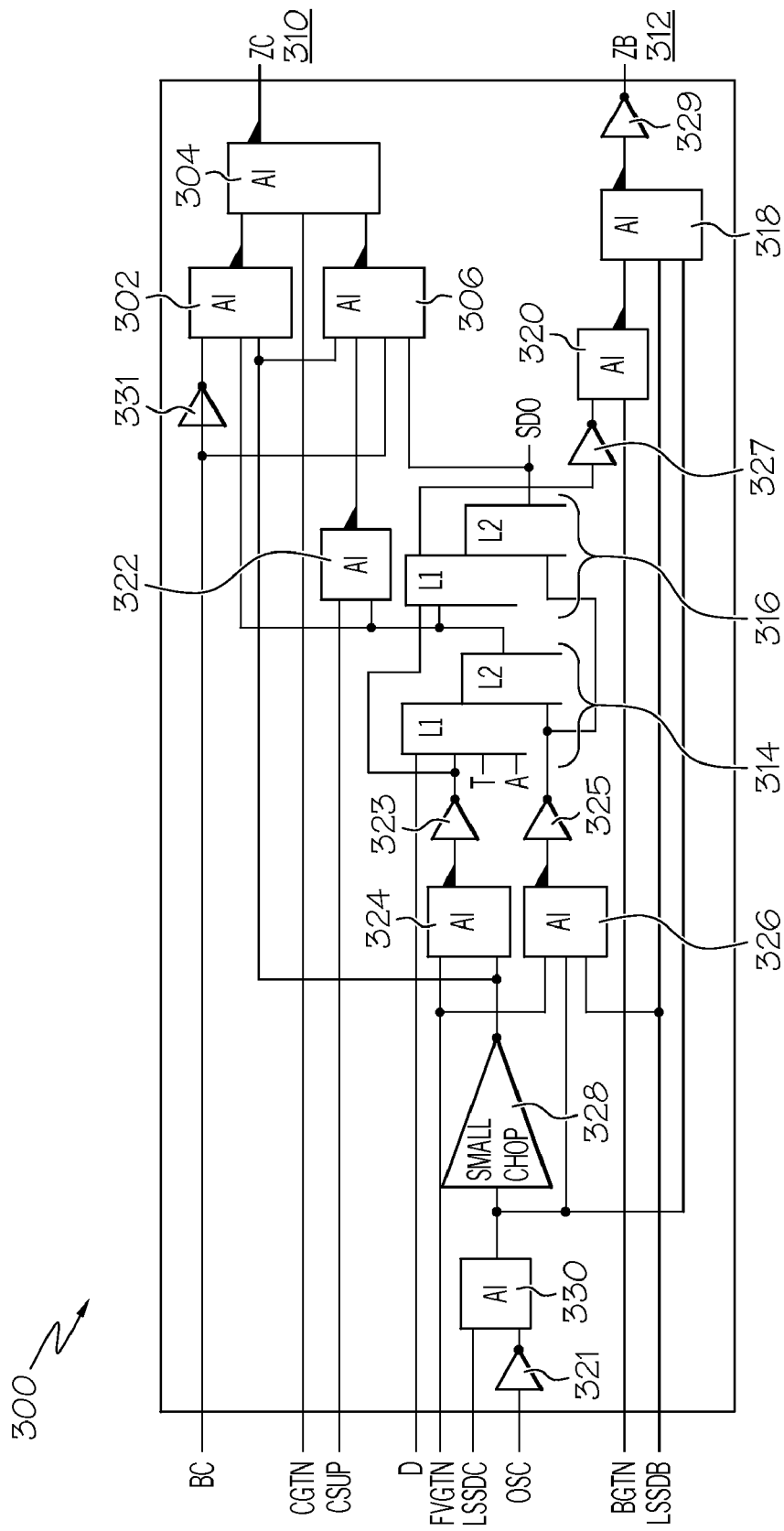
FIG. 3 depicts circuitry for an exemplary high speed clock splitter ("splitter") with an internal clock frequency-divider.

FIG. 3 depicts additional detail of an exemplary splitter 300, whose function substantially comports with that described at a high-level for splitter 200 shown in FIG. 2. Splitter 300 inputs and outputs various signals, which are named and defined as follows:

ZC—"C clock," which is a split output clock, and may be used to clock "capture" data into the master latch of a SRL ZB—"B clock," which is a split output clock, and may be used to clock "launch" data out of the slave latch of a SRL BC—control signal that determines whether ZC leads or lags ZB (in time or phase)

CGTN—C clock gate not—inverse logic signal that controls the release of the C clock at ZC CSUP—signal for controlling the suppression intermediate, starting, or ending waveforms of the "C clock"

D—scan data input, which also functions as a speed controller, which controls whether output clocks (at ZC and ZB) have a frequency that is at full speed, half speed, third speed, etc.

FVGTN—fixed value gate not—inverse logic signal that allows the D speed controller to be overridden, such that clocks in the rest of the design are allowed to run at full speed LSSDC—level-sensitive scan design (LSSD) C clock controller, which affords control of Shift Register Latches (SRLs), found in the splitter 300, and fed through the ZC pin in accordance with LSSD protocol OSC—oscillator, fixed speed clock generator BGTN—B clock gate not—inverse logic signal that controls the release of the B clock at ZB, disabling the internal splitter latch control LSSDB—level-sensitive scan design (LSSD) B clock controller, which affords control of Shift Register Latches (SRLs), found in the splitter 300, and fed through the ZB pin in accordance with LSSD protocol SDO—scan data out—output of scan data that is passing through splitter 300

Figure 6:
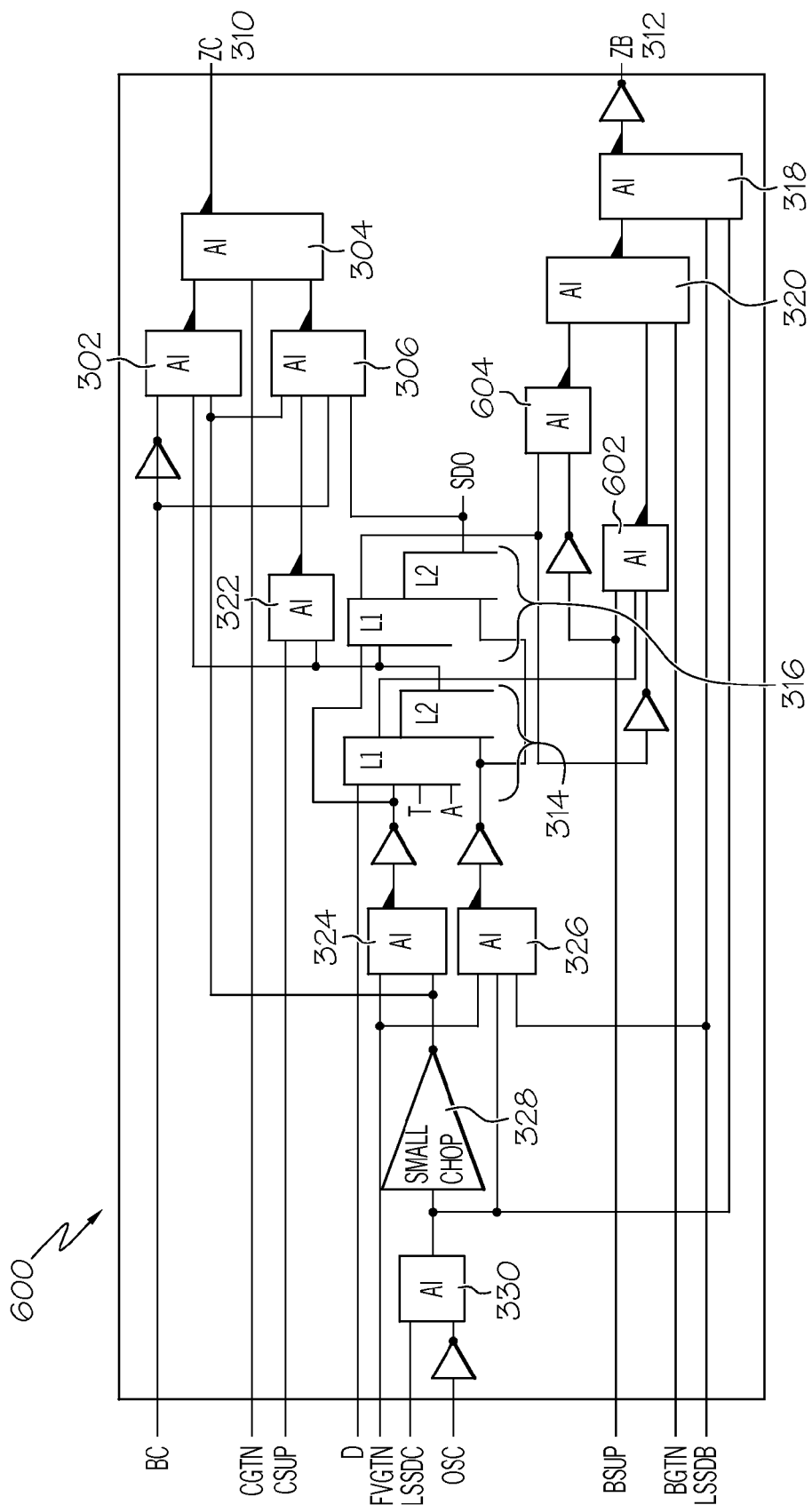
FIG. 6 illustrates circuitry for an alternative embodiment of a high speed clock splitter ("splitter") that allows suppression of timing-selected B clock signals being output, as shown in FIG. 7.

BSUP—signal for controlling the suppression intermediate, starting, or ending waveforms of the "B clock" (shown in FIG. 6)

Referring again FIG. 3, BC is input into an inverter 331, which outputs to an AND Inverted (AI) gate 302. (Note that an AI gate is logically equivalent to a NAND gate.) Based on the value of BC, an output from AI gate 302 to AI gate 304 causes the C clock at ZC output pin 310 to pulse before the B clock at ZB output pin 312. That is, due to the configuration of different AI gates and other logic shown, BC as a low signal will cause a different delay to ZC compared to BC being a high signal. AI gate 302 also receives input signals from Shift Register Latch (SRL) 314, as well as from small chopper 328, which provides clock separation between the rising ZC edge and the falling ZB edge to ensure the master and slave clocks are not simultaneously active.

AI 306 causes the C clock at ZC output pin 310 to pulse after the B clock at ZB output pin 312. Inputs to AI 306, which cause the C clock pulse to follow the B clock, include the output of small chopper 328, an output of AI 322 (whose inputs are discussed below), BC, and the output of SRL 316 (which can also be the Scan Data Out—SDO).

CGTN is input to AI 304, thus permitting the C clock to be pulsed from ZC output pin 310 under the direction of AI 302 or AI 306.

CSUP is input into AI 322, which causes C clock pulses to be suppressed in a controlled manner when combined with the output of SRL 314. Inputs to SRL 314 include input D, as well as inverted outputs of AI 324 and AI 326. Inputs to AI 324 include FVGTN and the output of small chopper 328. Input to the small chopper 328 is the output of AI 330, which has inputs of LSSDC and an inverted OSC clock signal. AI 330 thus provides a controlled input of raw signals which are cleaned up by small chopper 328. Note that the output of AI 330 also goes to the input of AI 326 and AI 318. Also input to AI 320 is BGTN and an inverted signal from the L1 latch in SRL 316, while AI 318 also receives LSSDB as an input. Output from AI 318 is a clock signal that, after being inverted by inverter 329, is put on ZB output pin 312.

Note that in a conventional LSSD system, separate system and scan clocks are used to distinguish between normal operations and test mode. During normal operations, latches are used in pairs, wherein each has a normal data input, data output and clock. During test operations, however, the two latches form a master/slave pair with one scan input, one scan output and non-overlapping scan clocks (usually denoted as A and B), which are held low during system operations but cause the scan data to be latched when pulsed high during scan. In splitter 300, however, AI 318 allows scan gating via BGTN and functional gating from SRL 316. Thus, the LSSDB test clock signal is allowed to be shared for both normal functional test operations as well as scan operations (test mode), thus eliminating the need for a separate test clock input.

Utilizing the inputs described above, SRLs 314 and 316 are used for clock gating. That is, SRLs 314 and 316 provide a tight timing path that closely synchronizes the relative temporal positions of the B and C clock outputs from respective ZB output pin 312 and ZC output pin 310.

Note the existence of inverters 321, 323, 325, 327, 329, and 331, which may or may not have been described above, but which are utilized to provide appropriate inversion of inputs to components depicted.

Figure 4:
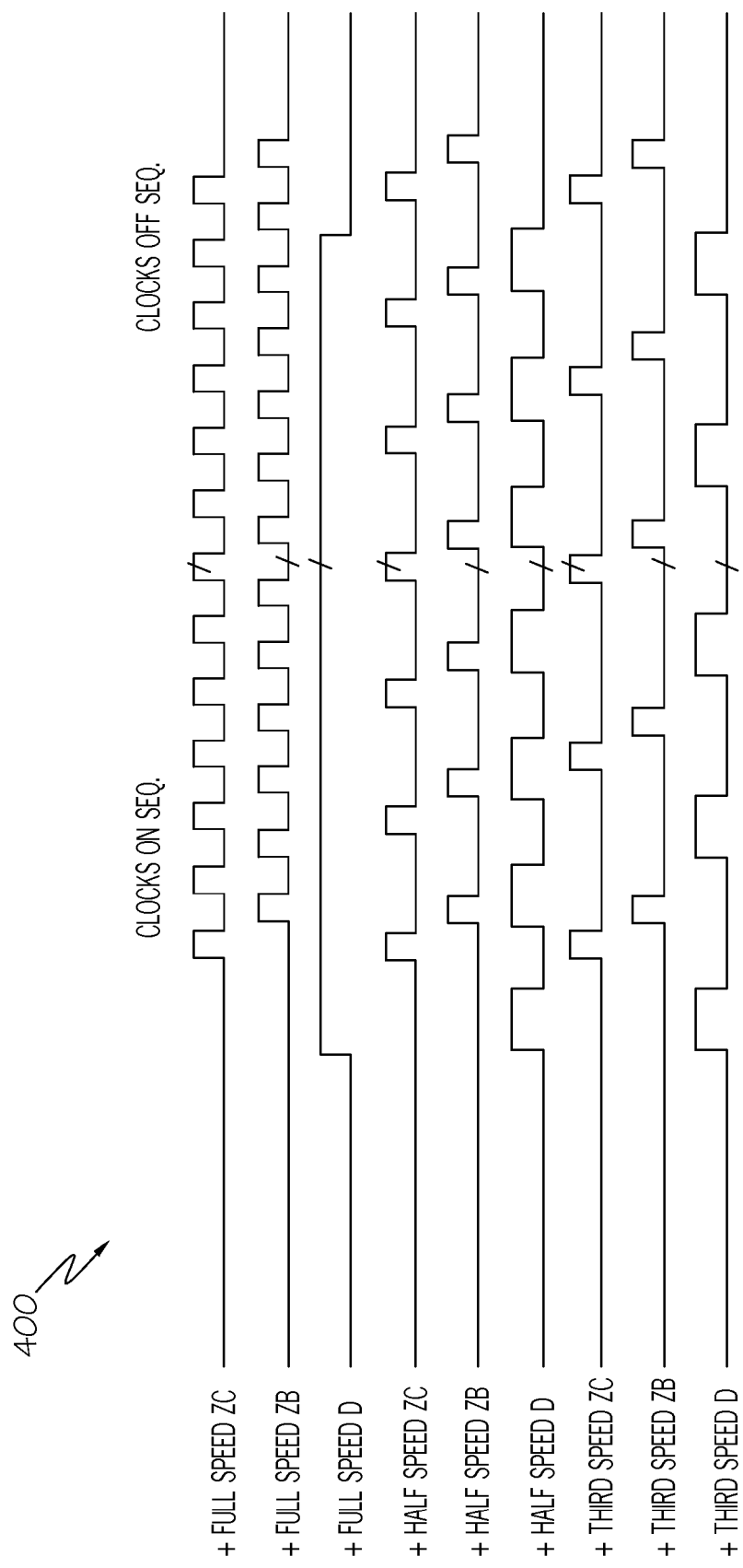
FIGS. 4-5 are timing charts for the high speed clock splitter shown in FIG. 3.

Referring now to FIG. 4, a timing chart 400 is presented showing the resulting C and B clocks at respective ZC output pin 310 and ZB output pin 312. At full speed (when D stays high and CSUP low), the B and C pulses are 180 degrees out of phase. However, when the D input is as shown, then one (for half speed) or two (for third speed) intermediate pulses for the C clock are suppressed. Note that intermediate pulses for the B clock are similarly suppressed so that the B follows the C clock pulses, allowing more cycle time from B to following C. Note also that, since splitter 300 serves as a suppression clock frequency-divider, pulse width is the same at all speeds, but duty cycle is reduced as a percentage of cycle time. Note also that all of the clock signals (full, half, third) are full cycle timed paths, while the half cycle clock gating paths are contained within the splitter from the SRLs 314 and 316.

Figure 5:
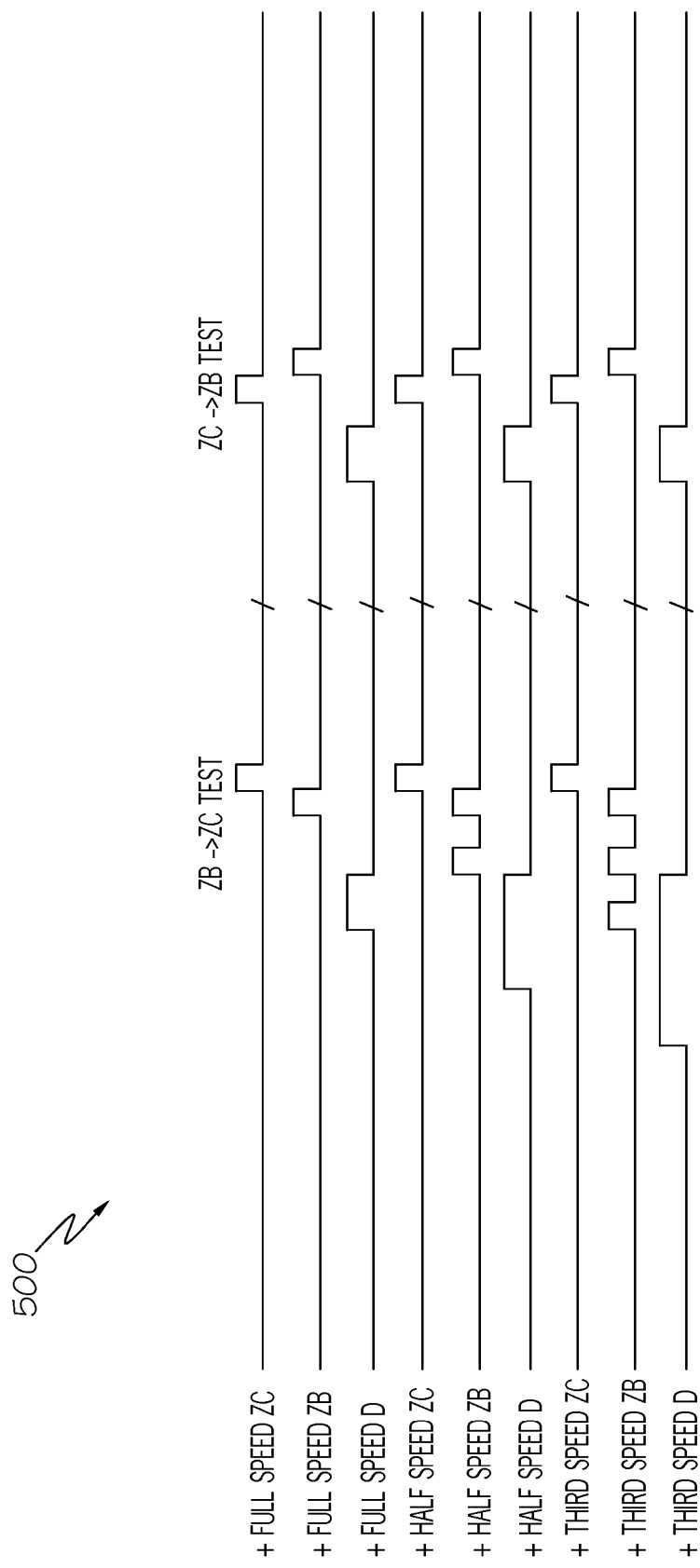

FIG. 5 shows timing chart 500, which depicts the timing of pulses when splitter 300 is used in at-speed testing (e.g., as part of an LBIST system). The ZC leading ZB clock timing (ZC→ZB) is rarely used. However, ZB leading ZC is often used, as in launching and capturing data from latches in SRLs. Note the extra ZB pulses for the divided clocks. The first B controls the data release from an SRL slave latch, with each subsequent ZB not changing the data. The timed path is therefore from the first ZB pulse to the only ZC pulse. This design, however, must time the final ZB versus the ZC to ensure that there is no pulse overlap. To avoid this problem, additional AIs 602 and 604 are added, as shown in the splitter 600 shown in FIG. 6.

Figure 7:
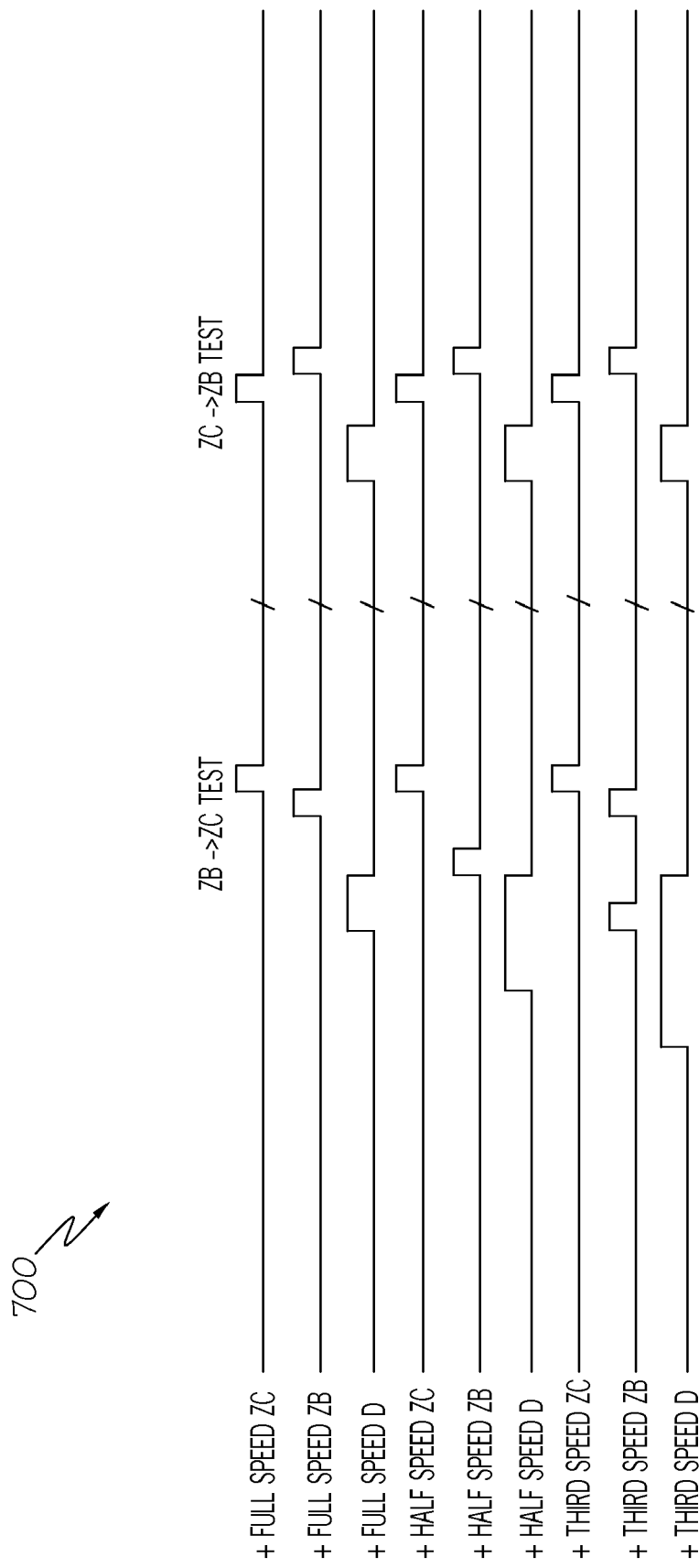

AI 602 has inputs from the inverted output of the L1 latch in SRL 316, the non-inverted output of the L1 latch in SRL 314, and BSUP, while AI 604 has inputs from the non-inverted output of the L1 latch of SRL 316 and the inverted BSUP signal. The output of AI 604 feeds into AI 320, which outputs to AI 318 in a manner described above for splitter 300. AIs 602 and 604 allow suppression of trailing ZB pulses during the ZB→ZC test, as shown in the timing chart 700 shown in FIG. 7.

Figure 8:
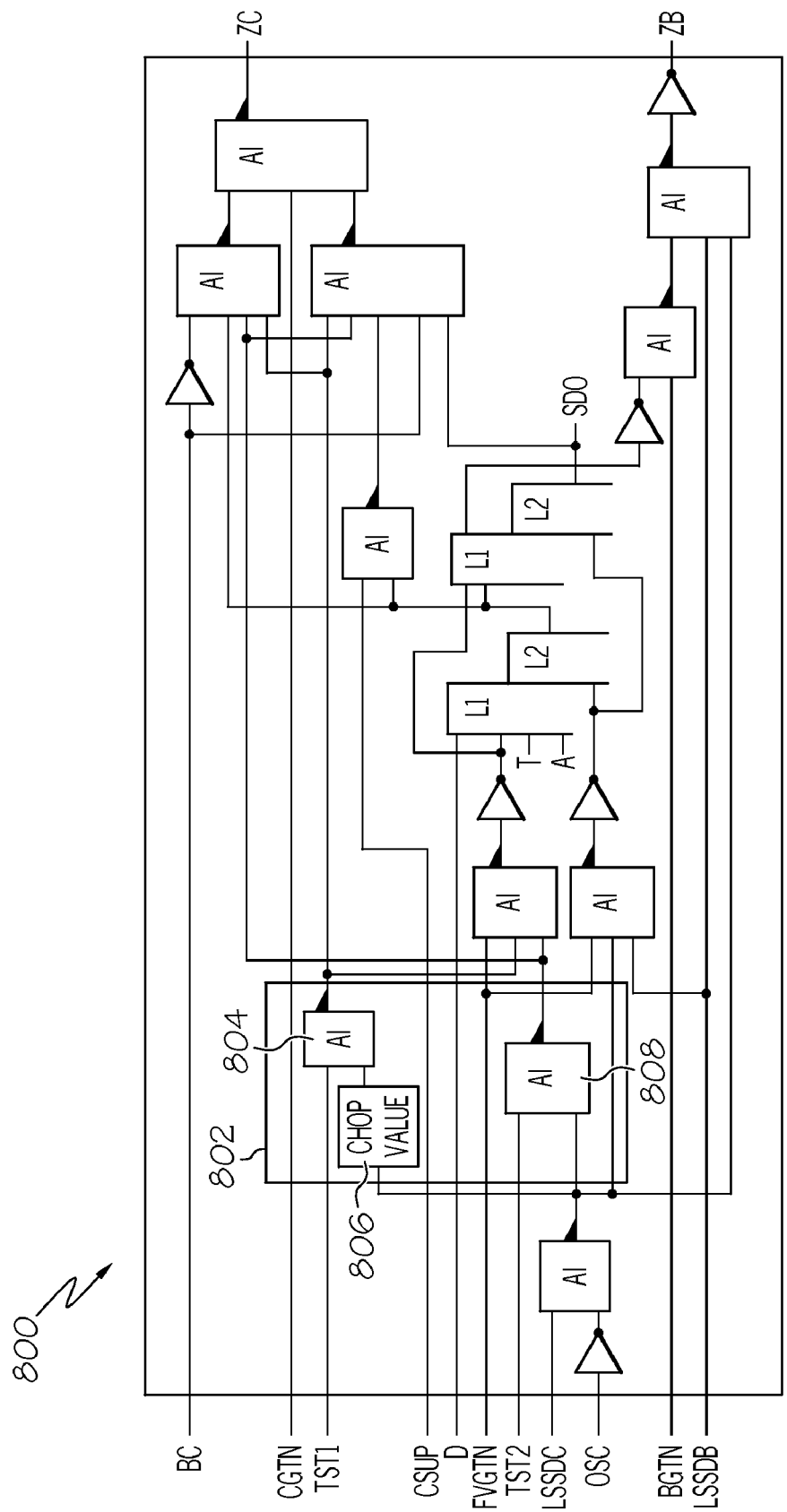
FIG. 8 depicts circuitry for an alternative embodiment of a high speed clock splitter that includes additional C clock signal chopping capability.
Figure 9:
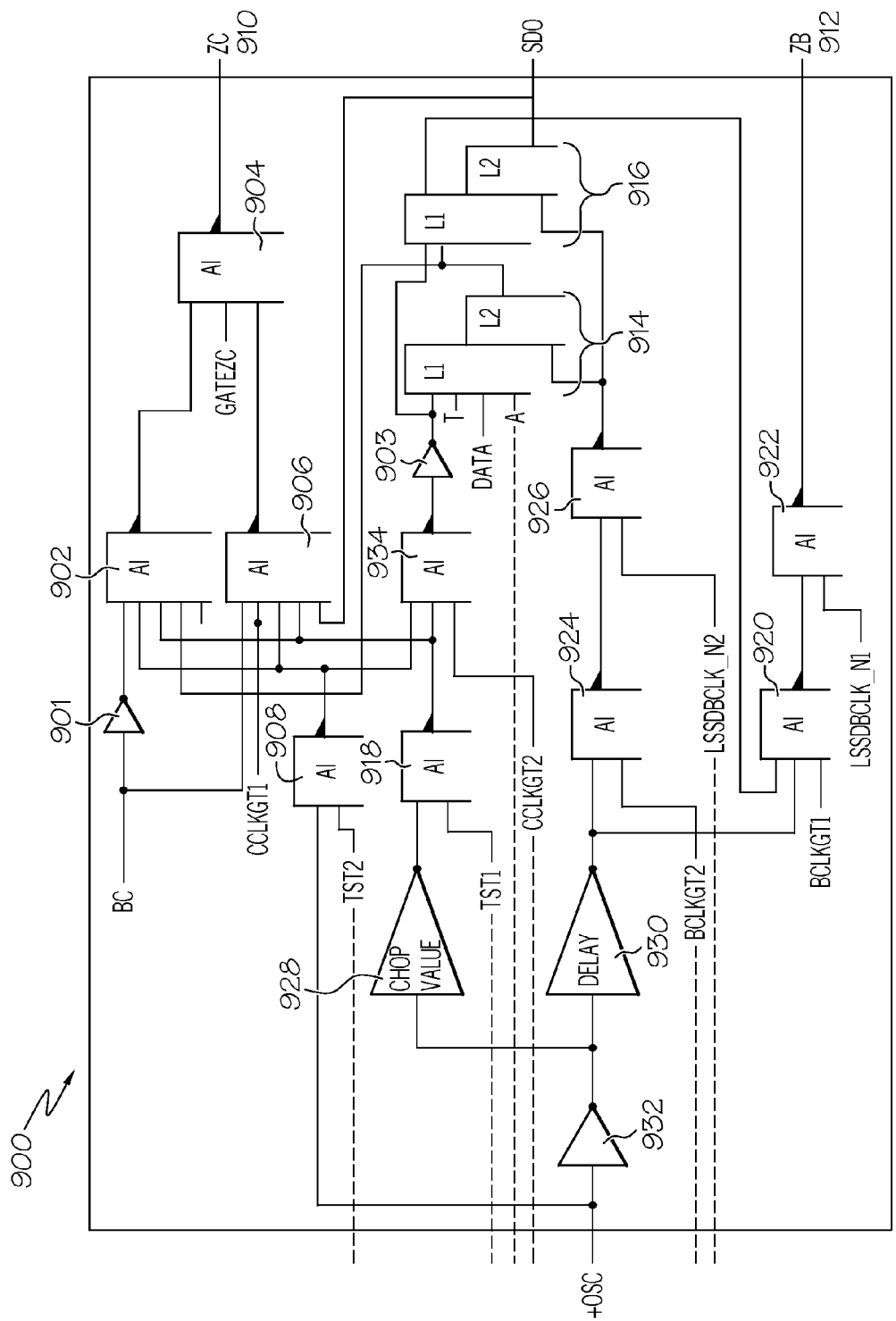
FIG. 9 illustrates circuitry for a high speed clock splitter that utilizes pulsing a DATA input to allow functional clock division.
Figure 10:
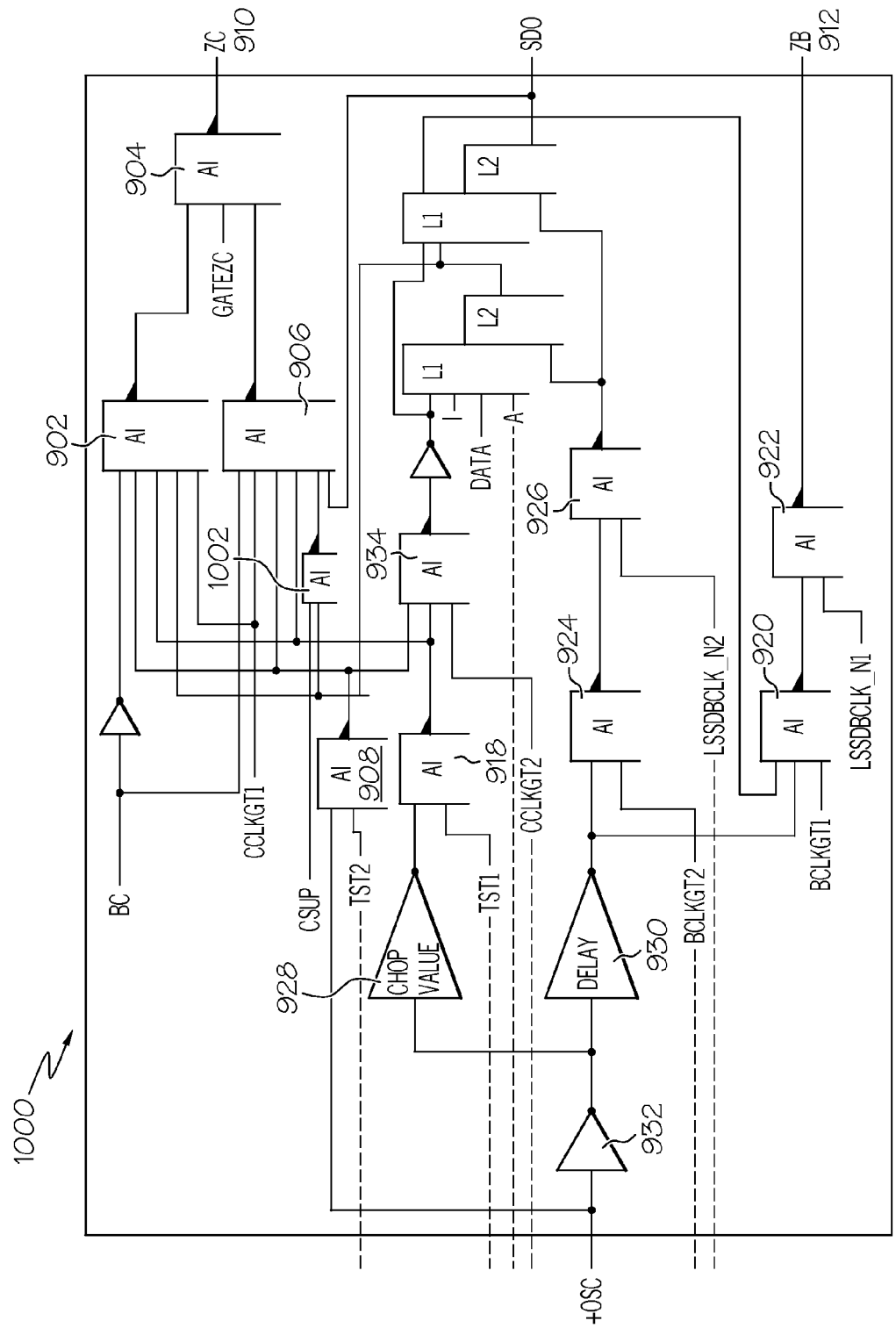
FIG. 10 depicts the circuitry shown in FIG. 9 with additional circuitry for suppressing the C clock.
Figure 11:
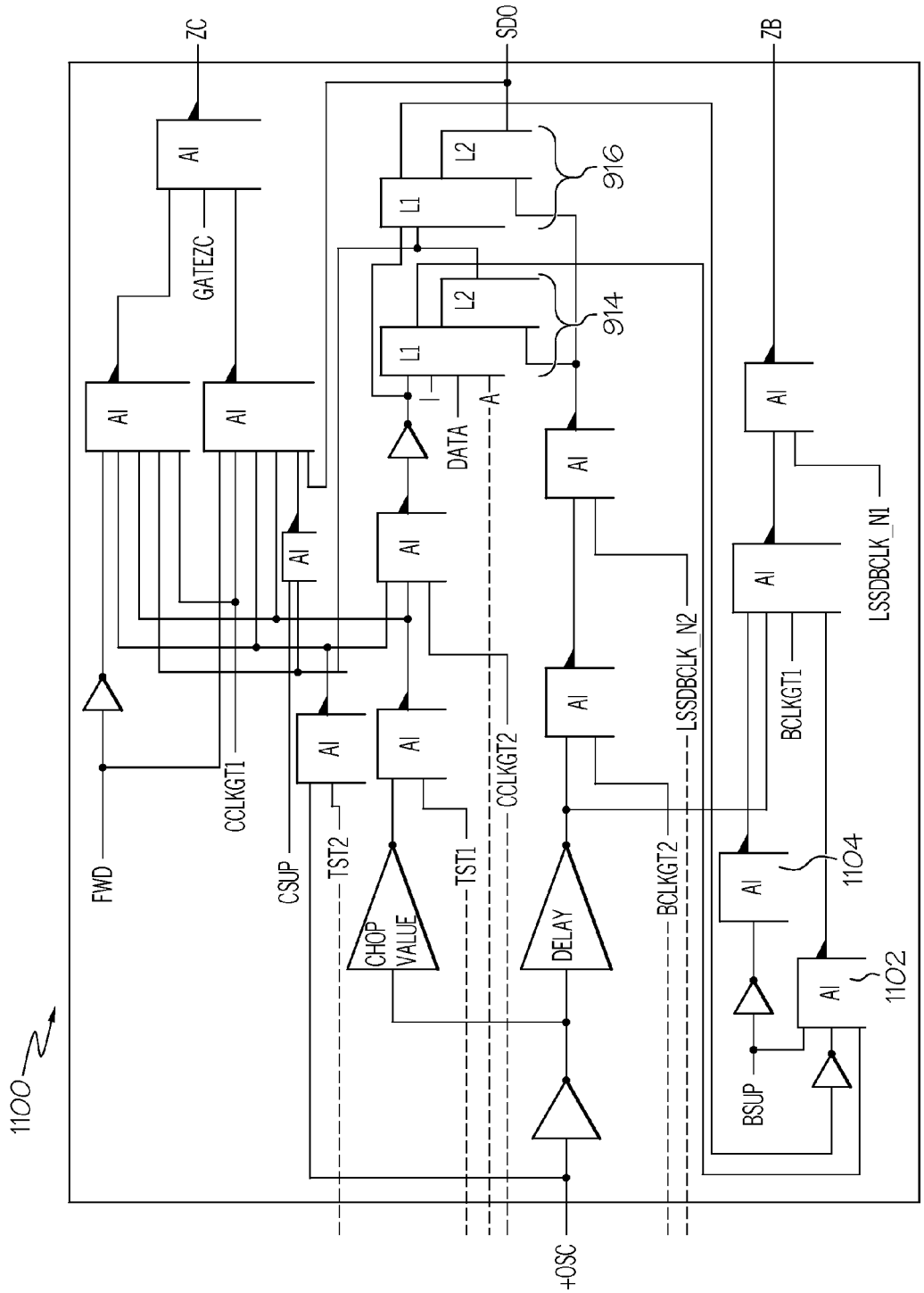
FIG. 11 illustrates the circuitry shown in FIG. 10 with additional circuitry for suppressing the B clock.

With reference now to FIG. 8, a splitter 800 is depicted. Splitter 800 has similar splitter/clock frequency-divider functionality as described above for splitter 300, but with an additional ZC chopping feature that is often useful in feeding Low Power Register Array (LPRA) clocks. Specifically, a chopper 802 includes a chop value 806 and two AIs 804 and 808. Test signals 1 and 2 are fed into respective AIs 804 and 808, thus providing exclusive paths for testability. FIGS. 9, 10, and 11 show another way to accomplish the functionality of splitter 800, but with a larger design.

Referring now to FIG. 9, a splitter 900 is presented. A BC signal, via an inverter 901, is fed into an AI 902, which also has inputs from C Clock Gate 1 (CCLKGT1) and the outputs of AI 908, AI 918 and SRL 914. AI 906 has inputs from the BC signal, C Clock Gate 1 (CCLKGT1), Scan Data Out (SDO), and the outputs of AI 908 and AI 918. AI 904 has inputs from the ZC gate (GATEZC) and the outputs of AI 902 and AI 906. The output of AI 904 is the C clock found at ZC pin 910.

A test control (TST2) signal is input to AI 908. A test control (TST1) is input into AI 918, along with an output of a chopper 928. The chopper 928 has a single input from the Oscillator (OSC) via an inverter 932. The output of inverter 932 also feeds an input to a delay 930, which feeds the input of an AI 924 as well as an AI 920. Using the SDO, output of delay 930, and a B clock gate (BCLKGT), AI 920, along with AI 922 (which includes an LSSD B Clock input (LSSDB-CLK_NI) generates a B clock signal found at ZB pin 912. Note further that an output of AI 918 is input to AI 934, which outputs to inverter 903, which outputs to SRL 916. Note also that AI 924 outputs to an input of AI 926.

AI gates 902, 906 and 904 allow the moving (time/phase shifting) of the ZC pulse (at ZC pin 910) to be before or after the ZB pulse (at ZB pin 912), thus generating a timing pattern such as that shown above in FIG. 4. However, suppression of the C clock pulses, as described above with splitter 300, is not possible using just the circuitry shown in FIG. 9. The splitter 1000, shown in FIG. 10, however, adds the C clock pulse suppression feature through the addition of an AI 1002, which accepts an input from a C suppression (CSUP) signal, which suppresses C clock pulses by suppressing C clock pulses at ZC pin 910. That is, the CSUP signal causes AI 1002 to block AI 906, which blocks 904 from pulsing unwanted C clock pulses.

To provide suppression of B clock pulses, splitter 1100, shown in FIG. 11, includes additional AIs 1102 and 1104. As depicted, inputs to AI 1102 include a B clock suppression signal (BSUP) and the inverted output of the L1 latch in the SRL 914. The inputs to AI 1104 include the output of AI 1102, the inverted (BSUP) signal, and the L1 latch of SRL 916. AI 1102 and AI 1104 thus provide for suppression of B clock pulses (per the control of the BSUP signal), such as shown above in timing table 700 in FIG. 7.

Figure 12:
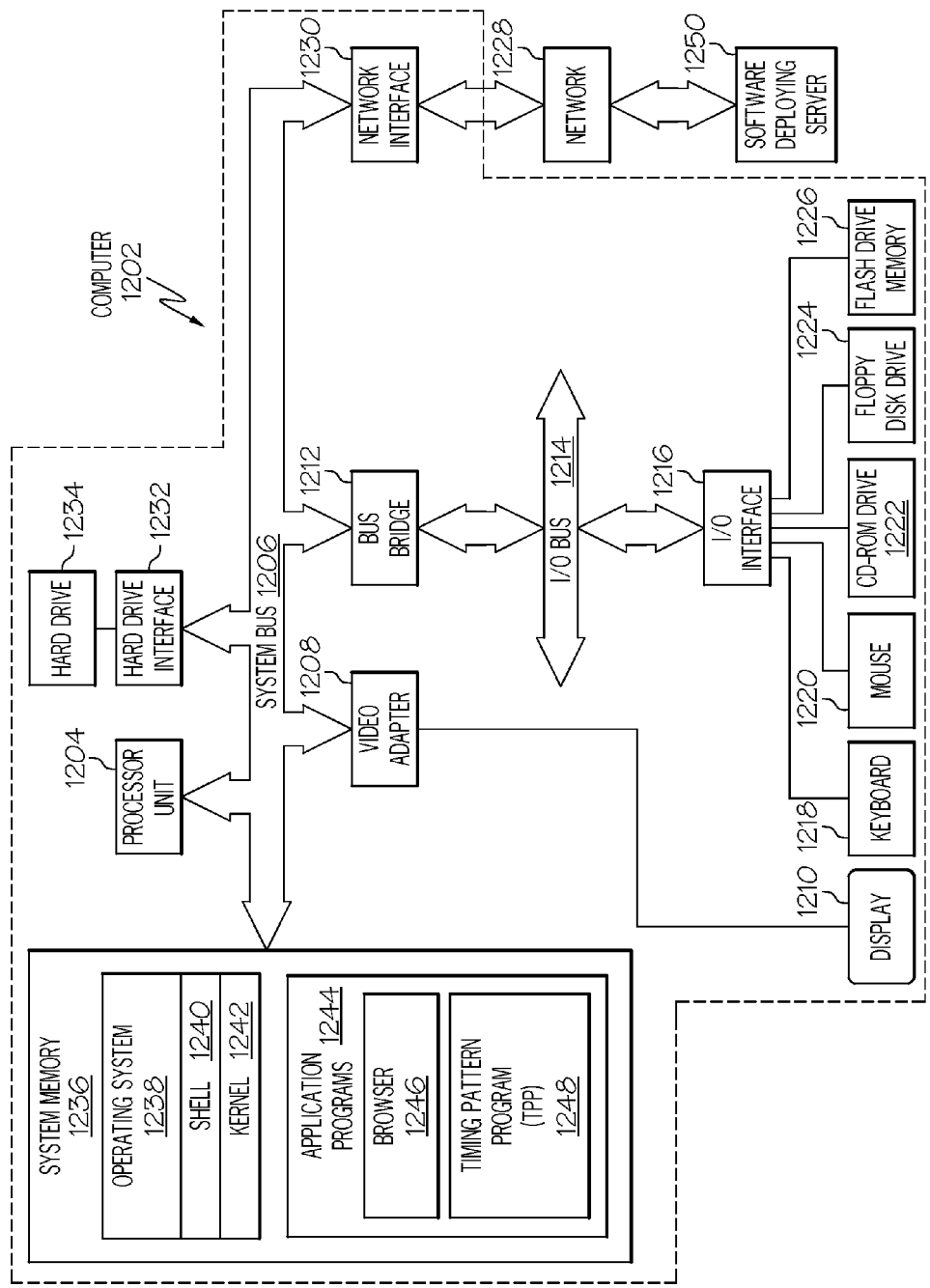
FIG. 12 depicts an exemplary computer in which the clock splitter described herein may be incorporated.

With reference now to FIG. 12, there is depicted a block diagram of a computer 1202, in which the present invention may be utilized. Computer 1202 includes a processor unit 1204 that is coupled to a system bus 1206. Within the circuitry of processor unit 1204 are one or more clock frequency-dividers/splitters, as described above in FIGS. 3, 6, 8-12, such that the logic shown in FIG. 12 is used to adjust the timing of clock signals used within processor 1204. Alternatively, the logic and software depicted for computer 1202 is used to control clock dividers (such as those depicted in FIGS. 3, 6, 8-12) in other (not shown) circuits.

A video adapter 1208, which drives/supports a display 1210, is also coupled to system bus 1206. System bus 1206 is coupled via a bus bridge 1212 to an Input/Output (I/O) bus 1214. An I/O interface 1216 is coupled to I/O bus 1214. I/O interface 1216 affords communication with various I/O devices, including a keyboard 1218, a mouse 1220, a Compact Disk-Read Only Memory (CD-ROM) drive 1222, a floppy disk drive 1224, and a flash drive memory 1226. The format of the ports connected to I/O interface 1216 may be any known to those skilled in the art of computer architecture, including but not limited to Universal Serial Bus (USB) ports.

Computer 1202 is able to communicate with a software deploying server 1250 via a network 1228 using a network interface 1230, which is coupled to system bus 1206. Network 1228 may be an external network such as the Internet, or an internal network such as an Ethernet or a Virtual Private Network (VPN).

A hard drive interface 1232 is also coupled to system bus 1206. Hard drive interface 1232 interfaces with a hard drive 1234. In a preferred embodiment, hard drive 1234 populates a system memory 1236, which is also coupled to system bus 1206. System memory is defined as a lowest level of volatile memory in computer 1202. This volatile memory includes additional higher levels of volatile memory (not shown), including, but not limited to, cache memory, registers and buffers. Data that populates system memory 1236 includes computer 1202's operating system (OS) 1238 and application programs 1244.

OS 1238 includes a shell 1240, for providing transparent user access to resources such as application programs 1244. Generally, shell 1240 is a program that provides an interpreter and an interface between the user and the operating system. More specifically, shell 1240 executes commands that are entered into a command line user interface or from a file. Thus, shell 1240 (as it is called in UNIX®), also called a command processor in Windows®, is generally the highest level of the operating system software hierarchy and serves as a command interpreter. The shell provides a system prompt, interprets commands entered by keyboard, mouse, or other user input media, and sends the interpreted command(s) to the appropriate lower levels of the operating system (e.g., a kernel 1242) for processing. Note that while shell 1240 is a text-based, line-oriented user interface, the present invention will equally well support other user interface modes, such as graphical, voice, gestural, etc.

As depicted, OS 1238 also includes kernel 1242, which includes lower levels of functionality for OS 1238, including providing essential services required by other parts of OS 1238 and application programs 1244, including memory management, process and task management, disk management, and mouse and keyboard management.

Application programs 1244 include a browser 1246. Browser 1246 includes program modules and instructions enabling a World Wide Web (WWW) client (i.e., software deploying server 1250) to send and receive network messages to the Internet using HyperText Transfer Protocol (HTTP) messaging, thus enabling communication with computer 1202. In one embodiment of the present invention, software deploying server 1250 may utilize a same or substantially similar architecture as shown and described for computer 1202.

Also stored with system memory 1236 is a Timing Pattern Program (TPP) 1248, which includes some or all software code needed to control the clock frequency-divider/splitters described above, including some or all of the signal inputs described above. TPP 1248 may be deployed from software deploying server 1250 to client computer 1202 in any automatic or requested manner, including being deployed to client computer 1202 in an on-demand basis. Similarly, TPP 1248 may be deployed to software deploying server 1250 from another software deploying server (not shown).

The hardware elements depicted in computer 1202 are not intended to be exhaustive, but rather are representative to highlight essential components required by the present invention. For instance, computer 1202 may include alternate memory storage devices such as magnetic cassettes, Digital Versatile Disks (DVDs), Bernoulli cartridges, and the like. These and other variations are intended to be within the spirit and scope of the present invention.

It should be understood that at least some aspects of the present invention may alternatively be implemented in a program product. Programs defining functions of the present invention can be delivered to a data storage system or a computer system via a variety of signal-bearing media, which include, without limitation, non-writable storage media (e.g., CD-ROM), writable storage media (e.g., a floppy diskette, hard disk drive, read/write CD ROM, optical media), and communication media, such as computer and telephone networks including Ethernet. It should be understood, therefore in such signal-bearing media when carrying or encoding computer readable instructions that direct method functions in the present invention, represent alternative embodiments of the present invention. Further, it is understood that the present invention may be implemented by a system having means in the form of hardware, software, or a combination of software and hardware as described herein or their equivalent.

The presently presented splitter thus provides for a suppression style clock frequency-divider function that is built into the splitter. This allows for the use of a common oscillator clock signal to use different speed domains, easing timing on designs by enabling more opportunity for Common Path Pessimism Removal (CPPR), while still supporting LSSD at speed clock gating for LBIST through C and B clock suppression and relative phase adjustment (ZC→ZB or ZB→ZC).

Specifically, one embodiment of the presently described clock splitter (as shown in an exemplary embodiment in FIG. 2 as splitter 200) comprises an oscillator clock splitter (210), wherein the oscillator clock splitter (210) splits an oscillator clock signal into a B clock and a C clock; a clock frequency-divider (204), wherein the clock frequency-divider (204) selectively suppresses clock pulses in the C clock to generate a slower C clock signal that is slower than the oscillator clock; and a B/C clock order logic (206), wherein the B/C clock order logic (206) phase shifts the C clock relative to a B clock. The clock frequency-divider (204) may selectively suppress pulses in the B clock to generate a slower B clock signal. The slower B and C clock signals may have a same or different frequency. In one embodiment, the clock splitter (200) is located at a terminal leaf of a clock tree.

In one embodiment, the novel clock frequency-divider/splitter is incorporated into a computer system. As described in an exemplary embodiment in FIG. 3 and FIG. 12, the novel clock frequency-divider/splitter is incorporated into a processor (1204) in a computer system (1202) that comprises a data bus (1206) coupled to the processor (1204); and a memory (1236) coupled to the data bus (1206). In exemplary form, the high speed clock frequency-divider/splitter (see FIG. 3) comprises: first (302) and second (306) AND Inverted (AI) gates that are coupled to a third AI gate (304); a fourth AI gate (330) coupled to an input of a chopper (328), wherein the chopper (328) has an output that is coupled to a fifth AI gate (324) and the first (302) and second (306) AI gates; a sixth AI gate (326) that is coupled to an output of the fourth AI gate (330), wherein an output of the AI gate (326) is coupled to an input of a first inverter (325); a second inverter (323) having an input that is coupled to an output of the fifth AI gate (324), wherein outputs of the first (325) and second (323) inverters are coupled to a first Shift Register Latch (SRL) (314), and wherein the output of the first inverter (325) is also coupled to an input of second SRL (316), and wherein the output of the second inverter (323) is also coupled to an input of a third inverter (327); a seventh AI gate (320) having an input that is coupled to an output of the third inverter (327); an eighth AI gate (318) having an input that is coupled to an output of the seventh AI gate (320); a fourth inverter (329) having an input that is coupled to an output of the eighth AI gate (318), wherein an output of the fourth inverter (329) produces a B clock signal and an output of the third AI gate (304) produces a C clock signal that are frequency and phase controlled by the high speed clock frequency-divider/splitter. In one embodiment, control of and signals to the novel clock frequency-divider/splitter is provided by a computer readable medium on which computer program instructions are stored.

As depicted in FIG. 3, in one embodiment, a high speed clock frequency-divider/splitter comprises: a first AND Inverted (AI) gate having an input that is coupled to an inverted BC clock order control signal (BC signal), wherein the BC signal determines a time-phase order between a B clock and a C clock that are output from the high speed clock leaf clock frequency-divider/splitter; a second AI gate having inputs that are coupled to the BC signal and a chopped oscillator signal; a third AI gate having inputs from an output of the first AI gate and an output of the second AI gate, wherein the third AI gate outputs the C clock; a fourth AI gate having inputs from the chopped oscillator signal and a B clock gate; and a fifth AI gate having inputs from an output of the fourth AI gate and a Level-Sensitive Scan Design (LSSD) C clock control signal (LSSDC), wherein the fifth AI outputs the B clock. The high speed clock leaf clock frequency-divider/splitter may further comprise: a sixth AI gate having an input that is coupled to a C clock suppression signal (CSUP), wherein the CSUP selectively suppresses C clock pulses to generate a clock signal having a lower frequency than the chopped oscillator signal; and a seventh AI gate having an input that is coupled to a B clock suppression signal (BSUP), wherein the BSUP selectively suppresses B clock pulses to generate a clock signal having a lower frequency than the chopped oscillator signal. In one embodiment, this high speed clock frequency-divider/splitter is located at a terminal leaf of a clock tree.

As depicted in exemplary form in FIGS. 8-11, in another embodiment a high speed clock leaf clock frequency-divider/ splitter comprises: a first inverter having inputs that are coupled to a BC (B/C clock order) signal, an output of a first Shift Register Latch (SRL), and an output of a chopper, wherein the first SRL has inputs from a speed control signal that is part of a scan data input (D); a second AI having inputs that are coupled to the output of the chopper, an output of a third AI, the BC signal, and a Scan Data Out (SDO) from a second SRL that is coupled to the first SRL, wherein the third AI has inputs that are coupled to a C clock suppression signal (CSUP) and the output of the first SRL; a fourth AI having inputs that are coupled to an output of the first AI, an output of the second AI, and a clock gate not (CGTN) inverse logic signal that controls a release of a C clock signal at a C clock pin that is coupled to an output of the fourth AI; a second inverter having an input that is coupled to an Oscillator (OSC) clock; a fifth AI having inputs coupled to a Level-Sensitive Scan Design (LSSD) C clock control signal (LSSDC) and an output of the second inverter, wherein an output of the first AI is coupled to an input to the chopper, an input to a sixth AI and an input to a seventh AI, wherein the seventh AI has additional inputs that are coupled to a B clock gate not (BGTN) inverse logic signal that controls a release of a B clock at a C clock pin that is coupled to an output of a third inverter, wherein the third inverter has an input that is coupled to the seventh AI; an eighth AI having a first input coupled to a fixed value gate not (FVGTN) inverse logic signal that is capable of overriding the data input (D) signal, wherein the eighth AI has a second input coupled to the output of the chopper, and wherein the FVGTN inverse logic signal is also coupled to an input to the sixth AI; a fourth inverter coupling an output of the eighth AI to an input to an L1 latch in the first SRL; and a fifth inverter coupling an output of the sixth AI to an L2 latch in the first SRL, wherein an output of the L2 latch in the first SRL is coupled to an input of the first L1 latch in the second SRL, and wherein the output of the first L1 latch in the second SRL is coupled to an input of a ninth AI via a sixth inverter, and wherein the ninth AI has an input coupled to a B gate not (BGTN) inverse logic signal that controls a release of a B clock at a ZB pin, and wherein an output of the ninth AI is coupled to an input of the seventh AI, and wherein a level-sensitive scan design B clock controller (LSSDB) is input to the seventh AI, wherein the high speed clock leaf clock frequency-divider/splitter controls a speed and phase of output B and C clocks through a use of the BC, CGTN, CSUP, D, FVGTN, LSSDC, OSC, BGTN and LSSDB signals. In this embodiment, the clock splitter may be located at a terminal leaf of a clock tree.

While the invention has been particularly shown and described with reference to a preferred embodiment, it will be understood by those skilled in the art that various changes in form and detail may be made therein without departing from the spirit and scope of the invention.

What is claimed is:

1. A high speed clock frequency-divider/splitter comprising:
    a first AND Inverted (AI) gate having an input that is coupled to an inverted BC clock order control signal (BC signal), wherein the BC signal exhibits a time-phase order between a B clock and a C clock that are output from a high speed clock leaf clock frequency-divider/splitter;
    a second AI gate having inputs that are coupled to the BC signal and a chopped oscillator signal;
    a third AI gate having inputs from an output of the first AI gate and an output of the second AI gate, wherein the third AI gate outputs the C clock;
    a fourth AI gate having inputs coupled to the chopped oscillator signal and to a B clock gate; and
    a fifth AI gate having inputs coupled to an output of the fourth AI gate and to a Level-Sensitive Scan Design (LSSD) C clock control signal (LSSDC), wherein the fifth AI outputs the B clock.

2. The high speed clock leaf clock frequency-divider/splitter of claim 1, further comprising:
    a sixth AI gate having an input that is coupled to a C clock suppression signal (CSUP), wherein the CSUP includes C clock pulses that are selectively suppressed to generate a clock signal having a lower frequency than the chopped oscillator signal.

3. The high speed clock leaf clock frequency-divider/splitter of claim 2, further comprising:
    a seventh and an eighth AI gate that have inputs that are coupled to a B clock suppression signal (BSUP), wherein the BSUP includes B clock pulses that are selectively suppressed to generate a clock signal having a lower frequency than the chopped oscillator signal.
    wherein the seventh AI has inputs that are coupled to a B clock gate not (BGTN) inverse logic signal that controls a release of a B clock at a C clock pin that is coupled to an output of a third inverter, wherein the third inverter has an input that is coupled to the seventh AI;
    wherein the eighth AI has a first input coupled to a fixed value gate not (FVGTN) inverse logic signal that is capable of overriding a scan data input (D) signal, wherein the eighth AI has a second input coupled to an output of a chopper, and wherein the FVGTN inverse logic signal is also coupled to an input to the sixth AI.

4. The high speed clock frequency-divider/splitter of claim 1, wherein the high speed clock frequency-divider/splitter is located at a terminal leaf of a clock tree associated with a clock input.

5. A high speed clock leaf clock frequency-divider/splitter comprising:
    a first inverter having inputs that are coupled to a BC (B/C clock order) signal, an output of a first Shift Register Latch (SRL), and an output of a chopper, wherein the first SRL has inputs from a speed control signal that is part of a scan data input (D);
    a second AI having inputs that are coupled to the output of the chopper, an output of a third AI, the BC signal, and an output from a second SRL that is coupled to the first SRL, wherein the third AI has inputs that are coupled to a C clock suppression signal (CSUP) and the output of the first SRL;
    a fourth AI having inputs that are coupled to an output of the first AI, an output of the second AI, and a clock gate not (CGTN) inverse logic signal that controls a release of a C clock signal at a C clock pin that is coupled to an output of the fourth AI;
    a second inverter having an input that is coupled to an Oscillator (OSC) clock;
    a fifth AI having inputs coupled to a Level-Sensitive Scan Design (LSSD) C clock control signal (LSSDC) and an output of the second inverter, wherein an output of the first AI is coupled to an input to the chopper, an input to a sixth AI and an input to a seventh AI, wherein the seventh AI has additional inputs that are coupled to a B clock gate not (BGTN) inverse logic signal that controls a release of a B clock at a C clock pin that is coupled to an output of a third inverter, wherein the third inverter has an input that is coupled to the seventh AI;
    an eighth AI having a first input coupled to a fixed value gate not (FVGTN) inverse logic signal that is capable of overriding the scan data input (D) signal, wherein the eighth AI has a second input coupled to the output of the chopper, and wherein the FVGTN inverse logic signal is also coupled to an input to the sixth AI;
a fourth inverter coupling an output of the eighth AI to an input to an L1 latch in the first SRL; and
a fifth inverter coupling an output of the sixth AI to an L2 latch in the first SRL, wherein an output of the L2 latch in the first SRL is coupled to an input of the first L1 latch in the second SRL, and wherein the output of the first L1 latch in the second SRL is coupled to an input of a ninth AI via a sixth inverter, and wherein the ninth AI has an input coupled to a B gate not (BGTN) inverse logic signal that controls a release of a B clock at a ZB pin, and wherein an output of the ninth AI is coupled to an input of the seventh AI, and wherein a level-sensitive scan design B clock controller (LSSDB) is input to the seventh AI;
wherein the high speed clock leaf clock frequency-divider/splitter controls a speed and phase of output B and C clocks through a use of the BC, CGTN, CSUP, D, FVGTN, LSSDC, OSC, BGTN and LSSDB signals.

6. The high speed clock leaf clock frequency-divider/splitter of claim 5, wherein the clock splitter is located at a terminal leaf of a clock tree.

7. A system comprising:
a processor;
a data bus coupled to the processor;
a memory coupled to the data bus; and
a high speed clock frequency-divider/splitter that is a component of the processor, wherein the high speed clock frequency-divider/splitter comprises:
an oscillator clock splitter, wherein the oscillator clock splitter splits an oscillator clock signal into a B clock and a C clock;
a clock frequency-divider, wherein the clock frequency-divider selectively suppresses clock pulses in the C clock to generate a slower C clock signal that has a lower frequency than the oscillator clock; and
a B/C clock order logic, wherein the B/C clock order logic phase shifts the C clock relative to a B clock;
wherein the high speed clock frequency-divider/splitter further comprises:
first and second AND Inverted (AI) gates that are coupled to a third AI gate;
a fourth AI gate coupled to an input of a chopper, wherein the chopper has an output that is coupled to a fifth AI gate and the first and second AI gates;
a sixth AI gate that is coupled to an output of the fourth AI gate, wherein an output of the AI gate is coupled to an input of a first inverter;
a second inverter having an input that is coupled to an output of the fifth AI gate, wherein outputs of the first and second inverters are coupled to a first Shift Register Latch (SRL), and wherein the output of the first inverter is also coupled to an input of second SRL, and wherein the output of the second inverter is also coupled to an input of a third inverter;
a seventh AI gate having an input that is coupled to an output of the third inverter;
an eighth AI gate having an input that is coupled to an output of the seventh AI gate; and
a fourth inverter having an input that is coupled to an output of the eighth AI gate;
wherein an output of the fourth inverter produces a B clock signal and an output of the third AI gate produces a C clock signal that is frequency and phase controlled by the high speed clock frequency-divider/splitter.

* * * * *